(12) United States Patent
Bowers et al.

(10) Patent No.: US 8,693,509 B2
(45) Date of Patent: Apr. 8, 2014

(54) LOSS MODULATED SILICON EVANESCENT LASERS

(75) Inventors: John E. Bowers, Santa Barbara, CA (US); Daoxin Dai, Hangzhou (CN)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 12/827,776

(22) Filed: Jun. 30, 2010

(65) Prior Publication Data
US 2012/0002694 A1    Jan. 5, 2012

(51) Int. Cl.
*H01S 3/10*    (2006.01)
*H01S 5/323*    (2006.01)

(52) U.S. Cl.
USPC ............... 372/12; 372/31; 372/43.01

(58) Field of Classification Search
USPC ........................... 372/43.01, 12, 31
See application file for complete search history.

(56) References Cited

U.S. PATENT DOCUMENTS

| | | | | |
|---|---|---|---|---|
| 3,970,959 A | * | 7/1976 | Wang et al. | 372/96 |
| 4,563,765 A | * | 1/1986 | Tsang et al. | 372/50.22 |
| 5,086,430 A | * | 2/1992 | Kapon et al. | 372/50.123 |
| 7,262,902 B2 | * | 8/2007 | Burns et al. | 359/321 |
| 7,613,401 B2 | * | 11/2009 | Matsui et al. | 398/201 |
| 7,751,654 B2 | * | 7/2010 | Lipson et al. | 385/1 |
| 2008/0002929 A1 | * | 1/2008 | Bowers et al. | 385/15 |
| 2008/0285606 A1 | * | 11/2008 | Kippenberg et al. | 372/32 |
| 2009/0245298 A1 | * | 10/2009 | Sysak et al. | 372/22 |
| 2010/0158429 A1 | * | 6/2010 | Popovic | 385/3 |
| 2011/0064106 A1 | * | 3/2011 | Xu et al. | 372/45.01 |

OTHER PUBLICATIONS

PCT International Search Report and Written Opinion dated Oct. 20, 2011 (PCT International Application No. PCT? US2011/042633).
Park, H., et al., "A Hybrid AlGaInAs-siliconEvanescent Waveguide Photodetector," Optics Express, 15(10), pp. 6044-6052, May 2007.

* cited by examiner

*Primary Examiner* — Jessica Stultz
*Assistant Examiner* — Michael Carter
(74) *Attorney, Agent, or Firm* — Kaplan Breyer Schwarz & Ottesen, LLP

(57) ABSTRACT

Loss modulated silicon evanescent lasers are disclosed. A loss-modulated semiconductor laser device in accordance with one or more embodiments of the present invention comprises a semiconductor-on-insulator (SOI) structure resident on a first substrate, the SOI structure comprising a waveguide in a semiconductor layer of the SOI structure, and a semiconductor structure bonded to the semiconductor layer of the SOI structure, wherein at least one region in the semiconductor layer of the SOI structure controls a photon lifetime in the semiconductor laser device.

14 Claims, 7 Drawing Sheets

LOSS MODULATED SILICON EVANESCENT LASERS

STATEMENT REGARDING FEDERALLY SPONSORED RESEARCH OR DEVELOPMENT

This invention was made with Government support under Grant No. 482530-25615, awarded by DARPA. The Government has certain rights in this invention.

BACKGROUND OF THE INVENTION

1. Field of the Invention

The present invention relates generally to semiconductor devices, and, more specifically, to loss modulated silicon evanescent lasers.

2. Description of the Related Art

Semiconductor chip level bonded devices have found uses in several consumer and commercial applications. Typically, semiconductor devices are made from a single type of material, or different types of material are grown onto a substrate based on lattice matching and compatible crystalline structures. As such, devices manufactured from semiconductor materials from Groups III and V of the periodic table materials) are typically grown on gallium arsenide or other compound semiconductor substrates, while silicon devices are grown or fabricated on silicon substrates. III-V material-based devices are difficult to integrate with electronic devices fabricated on silicon because of lattice mismatches and incompatible crystalline structures between silicon and III-V materials.

Optical transmitters are one of the most important components of any optical communication system. Typically, optical transmitters are fabricated with semiconductor materials from Groups III and V (III-V) of the periodic table, e.g., Gallium Arsenide (GaAs). Such materials are typically used because Silicon (Si), typically used for electronic communication systems, has an indirect bandgap which makes silicon a poor photon (light) emitter, and thus silicon does not perform well in optical transmitter applications. The indirect bandgap and resultant poor light emission of silicon has limited the realization of an electrically pumped Si-based laser, which is one of the key elements for optical transmitters and Si-based optical communications systems.

Silicon is a preferred semiconductor material, because silicon is easily processed in a variety of ways, is readily available at high quality for reasonable cost, and complex supporting electronic circuits for communications systems are readily available in silicon. In recent years, silicon photonic devices (e.g., silicon devices that emit photons) have been extensively studied because of the potential for low-cost optoelectronic solutions. Silicon photonic devices would reduce device cost over III-V materials because the fabrication is compatible with silicon-based electronics, especially Complementary Metal-Oxide Semiconductor (CMOS) processing.

Recently, hybrid structures combining III-V active region and silicon optical waveguides have been demonstrated as a solution for electrically pumped Si-based lasers. Such devices have many desirable properties, including continuous wave laser output (lasing) at temperatures up to 105° C., continuous wave output powers up to 30 mW, and mode locking at 40 Gbit/s. Such hybrid III-V silicon "evanescent" structures comprise a III-V quantum-well region bonded to a Silicon-On-Insulator (SOI) wafer, with optical waveguides defined by trenches at the Si layer. In this way, the hybrid structure behaves like an inverse ridge waveguide. Such devices are called "evanescent" in that the transition between the III-V structure and the silicon structure within the device tends to vanish after bonding, as the optical mode of the device crosses the III-V/silicon boundary.

Although such lasers are now possible, for an optical transmitter to be realized with such devices, high-speed modulation of the optical signal is also desirable. Direct modulation of the injected pump current is a simple approach to such a problem, however, as the injection current is increased, the extinction ratio decreases, thus limiting the amount of injection current that can be applied. Further, direct modulation is limited in speed to typically less than 10 GHz, and the transmission distance of directly modulated signals is limited because of the wavelength "chirp" induced by the direct modulation. Direct modulation of the current also changes the gain of the laser, which causes the light output of the laser to vary, all of which are not desirable device characteristics in communications systems.

External modulators have also been evaluated to determine the extension of the modulation rate and transmission distance. Mach-Zender Interferometric (MZI) modulators, which are large (millimeter size) devices have been shown to increase modulation rate and transmission distance through carrier depletion in the waveguide, which introduces a fast refractive index modulation; however, such modulators are difficult to integrate with silicon and/or hybrid devices because of their large relative size.

It can be seen, then, that there is a need in the art for a silicon-based laser that can be used in optical transmission systems. It can also be seen that there is a need in the art for integration between a silicon-based laser and a modulator. It can also be seen that there is a need in the art for modulation techniques that can be more easily integrated with semiconductor laser devices.

SUMMARY OF THE INVENTION

To minimize the limitations in the prior art, and to minimize other limitations that will become apparent upon reading and understanding the present specification, the present invention provides methods for making loss-modulating lasers, and loss-modulated laser devices.

A loss-modulated semiconductor laser device in accordance with one or more embodiments of the present invention comprises a semiconductor-on-insulator (SOI) structure resident on a first substrate, the SOI structure comprising a waveguide in a semiconductor layer of the SOI structure, and a semiconductor structure bonded to the semiconductor layer of the SOI structure, wherein at least one region in the semiconductor layer of the SOI structure controls a photon lifetime in the semiconductor laser device.

Such a device further optionally comprises the at least one region in the semiconductor layer of the SOI structure being at least one doped region proximate to the waveguide, the at least one doped region proximate to the waveguide being an n-doped region on a first side of the waveguide and a p-doped region on a second side of the waveguide, an optical mode of the loss-modulated semiconductor laser device being resident in the semiconductor layer and at least a portion of the semiconductor structure, the n-doped region and the p-doped region controlling a distributed loss of the loss-modulated semiconductor laser device, and the at least one doped region controlling a distributed loss in an optical cavity of the loss-modulated semiconductor device.

Such a device also further optionally comprises the at least one region in the semiconductor layer of the SOI structure being an optical feedback line coupled to a gain region of the loss-modulated semiconductor laser device, a modulation section, coupled to the optical feedback line, for controlling optical feedback to the gain region of the loss-modulated semiconductor laser device, the modulation section controlling at least one of a phase and an amplitude of a signal on the optical feedback line, and the optical feedback line controlling a feedback coefficient of the loss-modulated semiconductor laser device to modulate the loss-modulated semiconductor laser device.

A method for making a loss-modulated semiconductor laser device in accordance with one or more embodiments of the present invention comprises creating a waveguide structure and a modulation structure in a semiconductor-on-insulator (SOI) structure, coupling the modulation section to the waveguide structure, and bonding a semiconductor structure to the waveguide structure; wherein the modulation structure controls a photon lifetime in an optical cavity of the loss-modulated semiconductor laser device.

Such a method further optionally comprises the modulation section being coupled to the waveguide structure via an optical feedback line, the modulation section being at least one doped region in a semiconductor layer of the SOI structure, and the modulation section controlling at least one of a distributed loss and a feedback coefficient in the loss-modulated semiconductor laser device.

A semiconductor laser in accordance with one or more embodiments of the present invention comprises a semiconductor-on-insulator (SOI) region comprising a semiconductor layer including a waveguide and a modulation region, and a Group III-Group V (III-V) region, bonded to the semiconductor layer of the SOI region, wherein the modulation region modulates an output of the semiconductor laser by controlling the photon lifetime in the semiconductor laser.

Such a laser further optionally comprises the semiconductor laser operating in an optical transmission system, the modulation region being at least one doped region in the semiconductor layer, the semiconductor layer of the SOI structure comprising silicon, the modulation region controlling a phase delay of an optical feedback line, and the modulation region controlling an amplitude of an optical feedback line.

A semiconductor laser device in accordance with one or more embodiments of the present invention comprises a first waveguide structure having an optical cavity, wherein a loss in the optical cavity of the semiconductor laser device is modulated.

Such a semiconductor laser device further optionally comprises the loss in the optical cavity being modulated using a mirror, coupled to the optical cavity, the loss in the optical cavity being modulated by modulating an effective reflectivity of the mirror, the loss in the optical cavity being modulated with a second waveguide structure, coupled to the optical cavity, wherein light in the second waveguide interferes with light in the first waveguide structure, and an optical mode of the semiconductor laser device extending into a second waveguide, coupled to the first waveguide, and the loss in the optical cavity is modulated by modulating a loss in the second waveguide.

Other features and advantages are inherent in the system disclosed or will become apparent to those skilled in the art from the following detailed description and its accompanying drawings.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

The present invention describes direct modulation of a hybrid silicon evanescent laser. Rather than change the current to the laser, the present invention keeps the current at a relatively fixed amount, and the loss of the cavity is modulated. Such an approach allows for faster modulation of the output, as well as allowing for control of laser output illumination uniformity (also known as "pattern effects") and changes in laser output frequency ("chirp") in the laser outputs.

Within the loss modulation approach of the present invention, the gain and/or injected current can also be varied to compensate the output to achieve stability and reduce undesirable output effects.

The present invention also contemplates modulating a laser with a compact internal modulator, which achieves a compact silicon-based optical transmitter with easier integration than prior techniques. Through the techniques presented in the present invention, the photon lifetime in the laser cavity is varied to achieve high modulation rates and minimizes changes in optical transmitter frequency over previously designed systems and devices.

By decreasing the chirp present in the transmitter through the techniques presented herein, the present invention stabilizes the power output and thus allows for longer transmission distances, as well as providing additional bandwidth available for signal transmission that would otherwise be required for guard bands or other channel sizing issues in optical systems. Low chirp systems also allow for higher data throughput, as bit error rates decrease in low chirp systems.

Although described with respect to specific Group III-Group V (III-V) materials herein, i.e., Indium Phosphide (InP), Indium Gallium Arsenide (InGaAs), etc., other binary, tertiary, quaternary, or other combinatory materials within the III-V families, as well as II-VI or other materials, can be used in accordance with the present invention.

Figure 1:
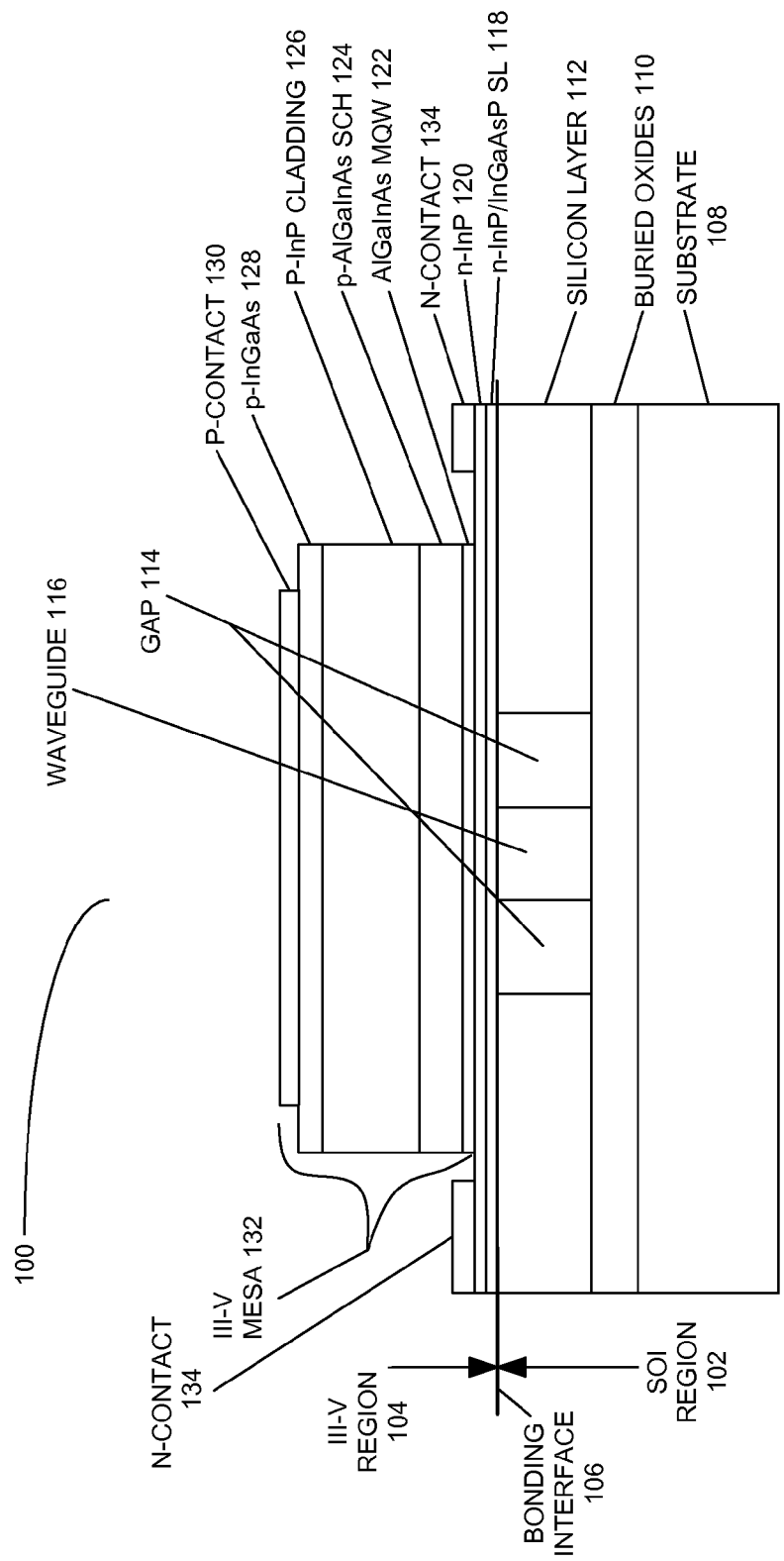
FIG. 1 illustrates a cross-section of a hybrid structure of the related art.

FIG. 1 illustrates a hybrid structure of the related art.

Device 100 is shown, with a Silicon-On-Insulator (SOI) region 102 bonded to a Group III-Group V (III-V) region 104 at bonding interface 106. SOI region typically comprises a silicon substrate 108, a buried oxide layer 110, and a silicon layer 112, which, in the case of device 100, is a silicon waveguide layer 112, although other materials or material platforms can be used within the scope of the present invention. Substrate 108 can be made from materials other than silicon as desired without departing from the scope of the present invention.

Silicon waveguide 112 has one or more gaps 114 such that waveguide 116 is between gaps 114. The optical signal within device 100 travels along waveguide 116, and the optical mode of the device is typically contained within waveguide 116.

Loss Modulation

The present invention modulates the photon lifetime $\tau_p$. Through this method of laser output control through lifetime-modulation, the present invention achieves a high-speed modulation as well as low chirp.

Theory and Structure

Within the present invention, there are several ways to modify the photon lifetime $\tau_p$ in a laser. The present invention modifies the photon lifetime through one or more of changing the group velocity $v_g$, the cavity length l, the feedback coefficient R, and the distributed loss $\alpha$. Among these approaches, two simple and effective ways are modifying the distribution loss a and the feedback coefficient R. The present invention presents two methods, corresponding to modifying $\alpha$ and R.

Figure 2:
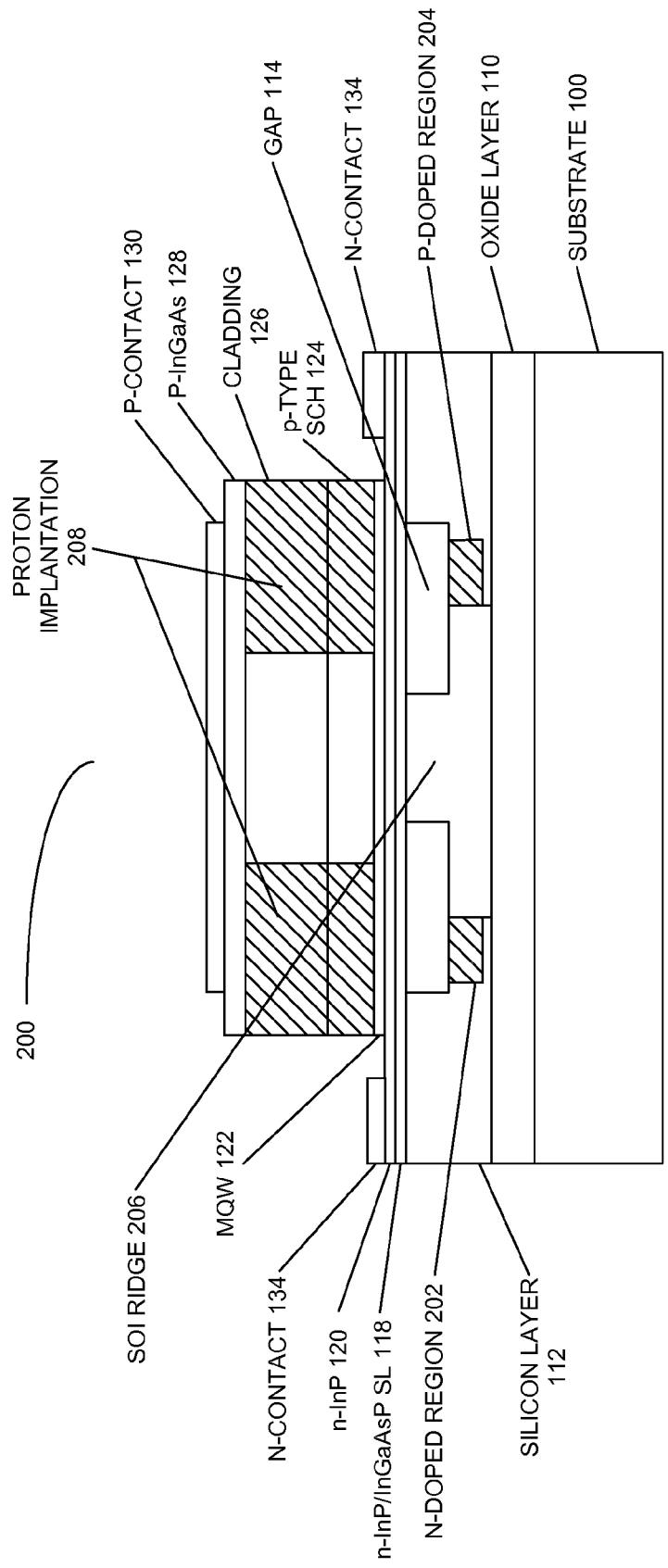
FIG. 2 illustrates a cross section of an embodiment of a loss-modulated hybrid laser of the present invention.

FIG. 2 illustrates an embodiment of a loss-modulated hybrid laser of the present invention.

Device 200 is shown, and within silicon layer 112, n-doped region 202 and p-doped region 204 are positioned underneath gaps 114. This allows device 200, which is also referred to as a $\tau_p$-modulated hybrid IIIV-Si evanescent laser 200, to modify the distributed loss $\alpha$ within device 200. The addition of regions 202 and 204 creates an additional p-n junction within device 200. The PN junction created by layer 120 and layer 124 at the III-V mesa 132 is used as an electrical charge injector (pump) to the gain section. The second PN junction at the two sides of the SOI ridge 206, created by the regions 202 and 204, has an external signal applied across regions 202 and 204, such that regions 202 and 204 provide a modulation signal by depleting the carrier density in the SOI ridge 206. In essence, the regions 202 and 204 act as a modulation section for the device 200 that is internal to the device 200. With such a structure of device 200, the present invention provides a high-speed hybrid laser modulator based on the micro-ring cavity or the Fabry-Perot (FP) cavity approach. If desired, only one doped region 202 or 204, e.g., doped region 202, can be used to provide the modulation within the waveguide, although such an approach may not provide a symmetrical field and may not be as controllable as with two or more regions 202 and 204.

Figure 3:
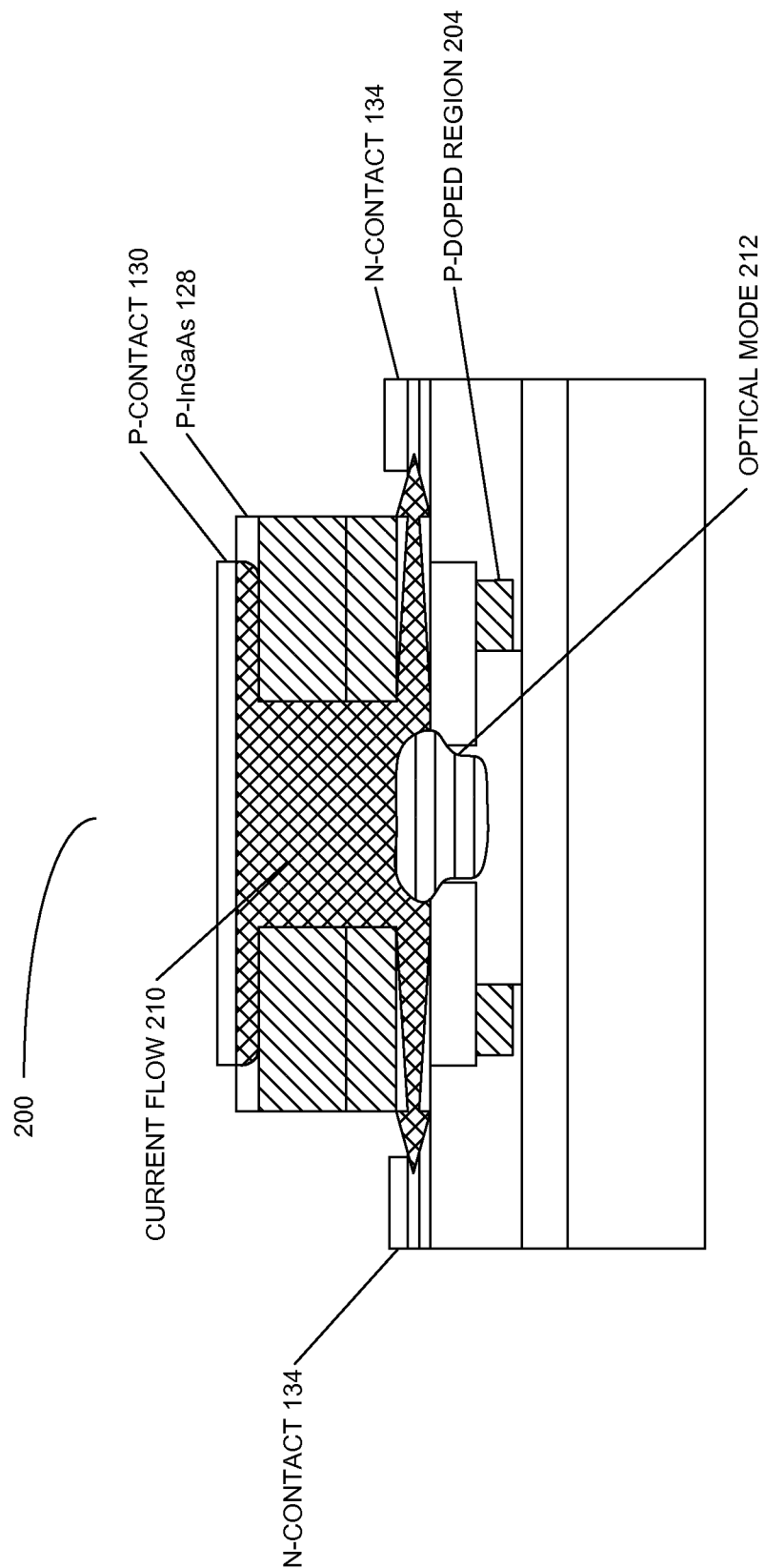
FIG. 3 illustrates the current flow and optical mode of the embodiment of the present invention illustrated in FIG. 2.

The current from p-contact 130 to n-contacts 134 is channeled through cladding layer 126 and SCH layer 124 through proton implantation areas 208. The current flow 210 and optical mode 212 for device 200 are shown in FIG. 3 for clarity.

Figure 4:
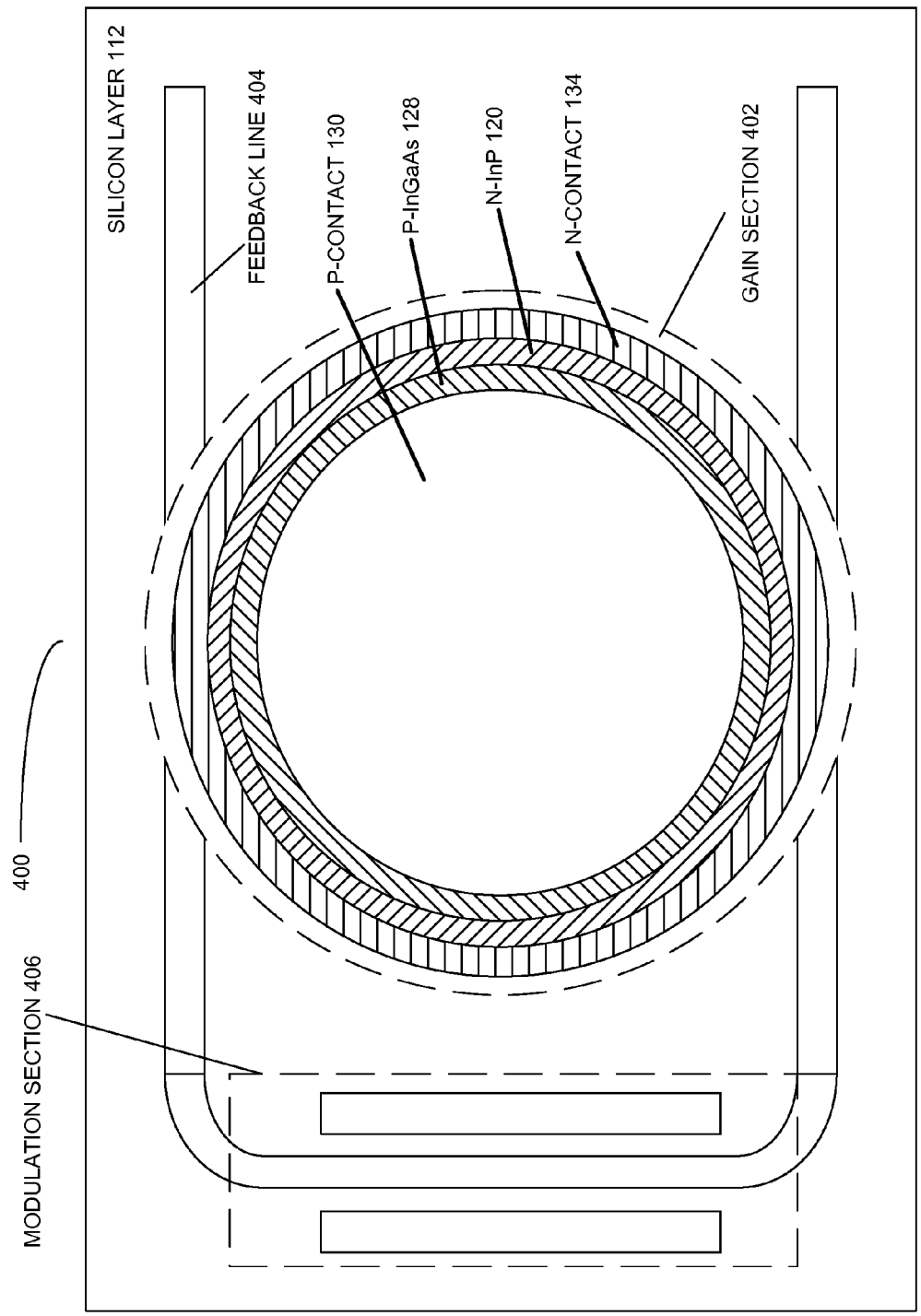
FIG. 4 illustrates another embodiment of a loss-modulated hybrid laser of the present invention.

FIG. 4 illustrates another embodiment of a loss-modulated hybrid laser of the present invention.

Device 400 is shown from a top view, with gain section 402, feedback line 404, and modulation section 406 shown. Gain section is similar to that shown in FIGS. 2 and 3, in that p-contact 130, p-InGaAs layer 128, and n-InP layers 120 are visible in the III-V mesa, n-contact 134 is also shown surrounding the III-V mesa, and silicon layer 112 is also visible from a top perspective view.

Within device 400, feedback line 404 (in the silicon layer 112) becomes a micro-ring optical feedback line through the gain region 402, which provides a gain similar to that used in a micro-ring laser structure of the related art. By modifying) the phase delay and/or the amplitude of the lightwave on feedback line 404 in modulation section 406, the feedback coefficient R is modified and consequently a $\tau_p$-modulation is obtained in device 400. The phase delay and/or amplitude can be modified by, for example, placing a PN junction in the silicon layer 112, and injecting/depleting the carriers in the PN junction as described with respect to regions 202 and 204 above; by placing an electro-absorption section e.g., a III-V layer, on top of the silicon layer 112, which can modify the carrier density in the area where the optical field is confined by injecting or depleting the carriers in the III-V layer and thus change the absorption of the device 400 as well as the refractive index of the device 400; and combining an electro-optical material with the silicon waveguide, where adding an electric field to the electro-optical material will change the refractive index of the electro-optical material and thus modulate the phase of the light in the waveguide. Such a structure could be used for hybrid III-V Si platform devices as described herein, as well as other material-based platforms such as InGaAsP lasers.

Measured and Calculated Device Characteristics

Figure 5:
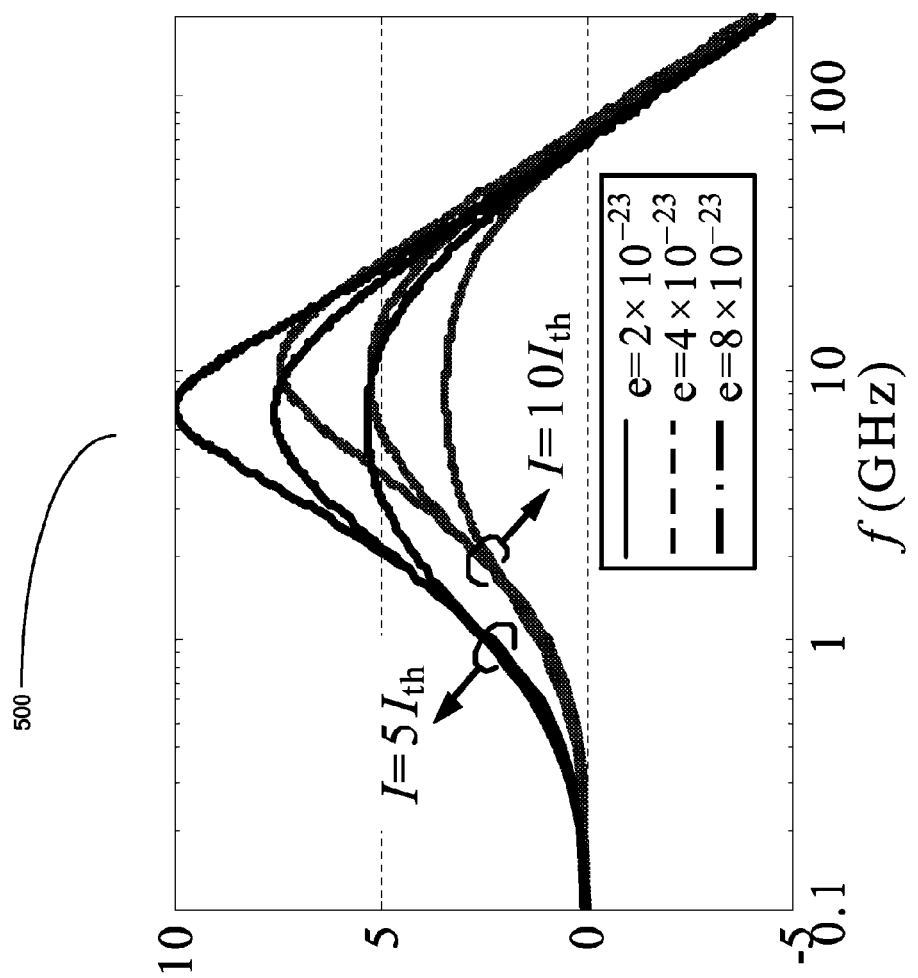
FIG. 5 illustrates the calculated frequency responses of $\tau_p$-modulated lasers in accordance with the present invention.

FIG. 5 illustrates the calculated frequency responses of $\tau_p$-modulated lasers in accordance with the present invention.

Graph 500 illustrates a small-signal modeling graph of 10 log $[s(\omega)s(0)]$ in decibels versus frequency, which gives a frequency response of devices 200-400 of the present invention. Various values of epsilon $\epsilon$ for the cases of I=5$I_{th}$ ($I_{th}$ is the threshold current value of the device) and I=10 $I_{th}$. Graph 500 indicates that the bandwidth of devices 200-400 of the present invention can have a high bandwidth (>100 GHz).

Figure 6A:
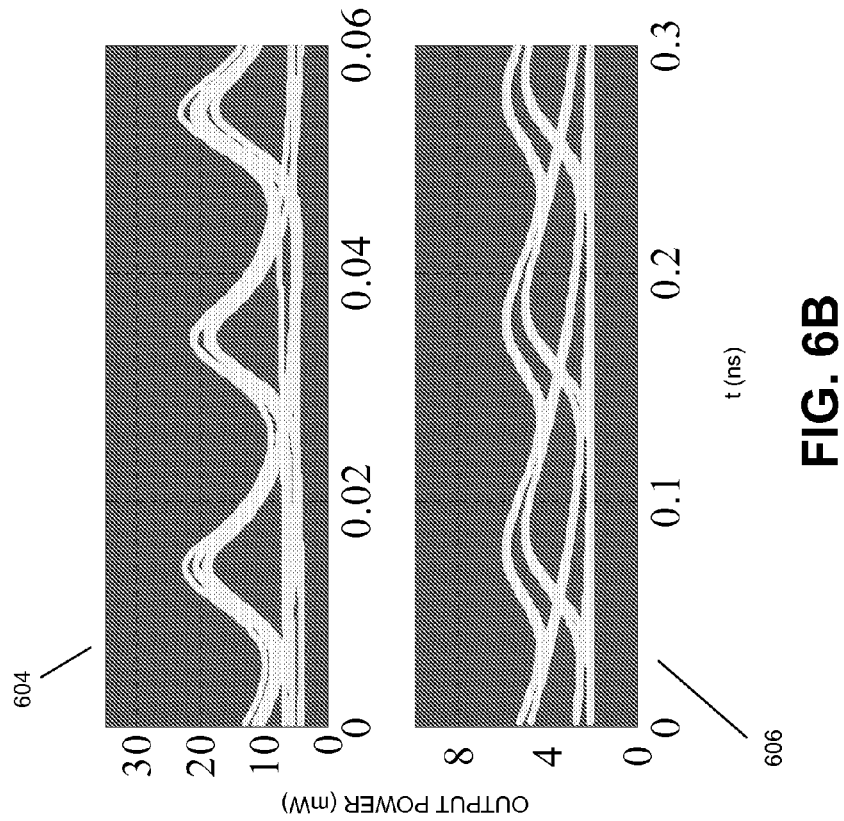
FIG. 6A illustrates the 3 dB-bandwidth as the square root of the current above the threshold of devices made in accordance with the present invention.

The 3 dB-bandwidth as the square root of the current above the threshold is given in FIG. 6A. Graph 600 illustrates the bandwidth for devices 200-400 of the present invention, and graph 602 illustrates bandwidths for direct current-modulated lasers of the related art for comparison. FIG. 6A indicates that the 3 dB-bandwidth (over 100 GHz) for the $\tau_p$-modulated laser is much higher than that that for the case of direct current-modulation (<10 GHz) for the same device structure.

Figure 6B:
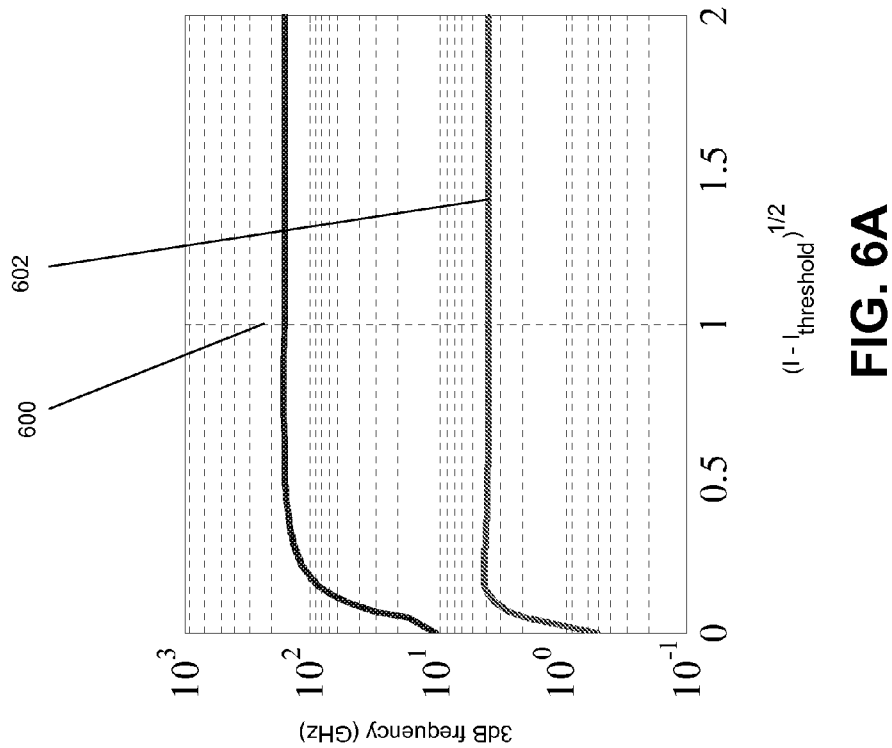
FIG. 6B illustrates simulated eye-diagrams for $\tau_p$-modulated lasers made in accordance with the present invention.

With the numerical simulation for the response at the time domain, we obtain a simulated eye-diagram 604 for the present $\tau_p$-modulated laser as shown in FIG. 6B. For this calculation, the photon lifetime has a Gaussian-type pulse modulation with a bit rate of 50 Gb/s. With $\tau_{p\_on}$=1.073 ps and $\tau_{p\_off}$=1.788 ps for the on- and off-states of the device and the injection current kept constant ($I_0$=0.15A), FIG. 6B illustrates that the eye is open in eye-diagram 604 for operation at 50 Gb/second. FIG. 6A indicates that higher bit rates are also possible within the present invention. For comparison, eye-diagram 606 for the conventional I-modulated laser with a bit rate of 10 Gb/second is also shown, with currents for the on- and off-states chosen as $I_{on}$=0.15A, and $I_{off}$=0.05A, respectively. The simulation result shows that it is possible to achieve a data rate of several Gbps. However, the eye-diagram 606 becomes closed for a relative high bit rate (e.g., 10 Gb/second).

Alternative Structures

Other structures can provide the modulation loss discussed in the present invention. For example, and not by way of limitation, a laser structure comprising a gain region (MQW 122) and a mirror structure, common in Distributed Bragg Reflector (DBR) and in other laser structures, where the effective reflectivity of the mirror can be modulated to modulate the loss in the laser cavity/SOI ridge 206, similar to using regions 204 and 202 to modulate the loss in the SOI ridge 206/optical cavity 210 as described above. Such modulation can be controlled in several ways, e.g., using a second waveguide, coupled to the waveguide/SOI ridge 206 in the optical cavity, where light in the second waveguide modulates the light in the optical cavity 210 through superposition and/or interference, or part of the optical mode of the SOI ridge can extend into a second waveguide/SOI ridge 206 where the loss can be modulated as described herein. Such a structure is shown, for example, U.S. patent application Ser. No. 11/534, 560, which application is incorporated by reference herein. Other structures are also possible given the teachings of the present invention.

Process Chart

Figure 7:
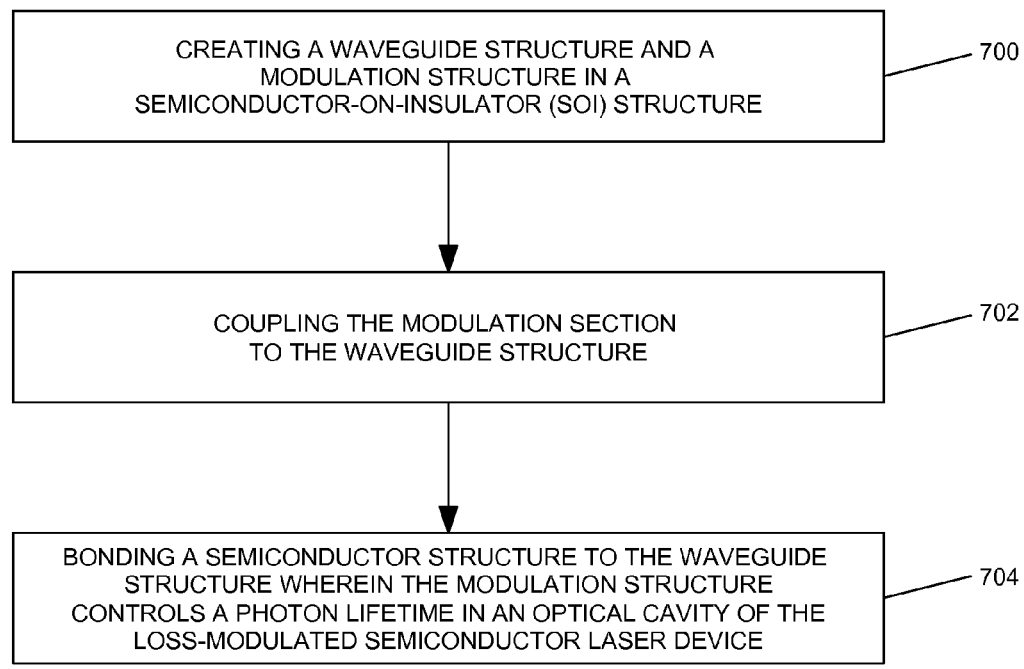
FIG. 7 illustrates a process chart in accordance with the present invention.

FIG. 7 illustrates a process chart in accordance with the present invention.

Box 700 illustrates creating a waveguide structure and a modulation structure in a semiconductor-on-insulator (SOI) structure.

Box 702 illustrates coupling the modulation section to the waveguide structure.

Box 704 illustrates bonding a semiconductor structure to the waveguide structure; wherein the modulation structure controls a photon lifetime in an optical cavity of the loss-modulated semiconductor laser device.

REFERENCES

The following references are incorporated herein by reference:

Hsu-Hao Chang, et al. "1310 nm silicon evanescent laser" Opt. Expr. 15, 11466-11471 (2007). Y-H. Kuo, et al., "High speed hybrid silicon evanescent electroabsorption modulator," Optics Express, 16(13), 9936-9941, Jun. 20 (2008).

H. Park, et al., "A Hybrid AlGaInAs-silicon Evanescent Waveguide Photodetector," Optics Express, 15(10), pp. 6044-6052, May (2007).

R. S. Tucker, "High-speed modulation of semiconductor lasers," J. Lightwave Technol. 3: 1180-1192 (1985).

A. S. Liu, et al., "High-speed optical modulation based on carrier depletion in a silicon waveguide," Opt. Expr. 15, 660-668 (2007).

J. E. Bowers, B. R. Hemenway, A. H. Gnauck, and D. P. Wilt, "High-speed InGaAsP Constricted-Mesa Lasers," IEEE J. Quantum Electron. 22, 833-843 (1986).

CONCLUSION

In summary, embodiments of the invention provide methods for making loss-modulating lasers, and loss-modulated laser devices.

A loss-modulated semiconductor laser device in accordance with one or more embodiments of the present invention comprises a semiconductor-on-insulator (SOI) structure resident on a first substrate, the SOI structure comprising a waveguide in a semiconductor layer of the SOI structure, and a semiconductor structure bonded to the semiconductor layer of the SOI structure, wherein at least one region in the semiconductor layer of the SOI structure controls a photon lifetime in the semiconductor laser device.

Such a device further optionally comprises the at least one region in the semiconductor layer of the SOI structure being at least one doped region proximate to the waveguide, the at least one doped region proximate to the waveguide being an n-doped region on a first side of the waveguide and a p-doped region on a second side of the waveguide, an optical mode of the loss-modulated semiconductor laser device being resident in the semiconductor layer and at least a portion of the semiconductor structure, the n-doped region and the p-doped region controlling a distributed loss of the loss-modulated semiconductor laser device, and the at least one doped region controlling a distributed loss in an optical cavity of the loss-modulated semiconductor device.

Such a device also further optionally comprises the at least one region in the semiconductor layer of the SOI structure being an optical feedback line coupled to a gain region of the loss-modulated semiconductor laser device, a modulation section, coupled to the optical feedback line, for controlling optical feedback to the gain region of the loss-modulated semiconductor laser device, the modulation section controlling at least one of a phase and an amplitude of a signal on the optical feedback line, and the optical feedback line controlling a feedback coefficient of the loss-modulated semiconductor laser device to modulate the loss-modulated semiconductor laser device.

A method for making a loss-modulated semiconductor laser device in accordance with one or more embodiments of the present invention comprises creating a waveguide structure and a modulation structure in a semiconductor-on-insulator (SOI) structure, coupling the modulation section to the waveguide structure, and bonding a semiconductor structure to the waveguide structure; wherein the modulation structure controls a photon lifetime in an optical cavity of the loss-modulated semiconductor laser device.

Such a method further optionally comprises the modulation section being coupled to the waveguide structure via an optical feedback line, the modulation section being at least one doped region in a semiconductor layer of the SOI structure, and the modulation section controlling at least one of a distributed loss and a feedback coefficient in the loss-modulated semiconductor laser device.

A semiconductor laser in accordance with one or more embodiments of the present invention comprises a semiconductor-on-insulator (SOI) region comprising a semiconductor layer including a waveguide and a modulation region, and a Group III-Group V (III-V) region, bonded to the semiconductor layer of the SOI region, wherein the modulation region modulates an output of the semiconductor laser by controlling the photon lifetime in the semiconductor laser.

Such a laser further optionally comprises the semiconductor laser operating in an optical transmission system, the modulation region being at least one doped region in the semiconductor layer, the semiconductor layer of the SOI structure comprising silicon, the modulation region controlling a phase delay of an optical feedback line, and the modulation region controlling an amplitude of an optical feedback line.

A semiconductor laser device in accordance with one or more embodiments of the present invention comprises a first waveguide structure having an optical cavity, wherein a loss in the optical cavity of the semiconductor laser device is modulated.

Such a semiconductor laser device further optionally comprises the loss in the optical cavity being modulated using a mirror, coupled to the optical cavity, the loss in the optical cavity being modulated by modulating an effective reflectivity of the mirror, the loss in the optical cavity being modulated with a second waveguide structure, coupled to the optical cavity, wherein light in the second waveguide interferes with light in the first waveguide structure, and an optical mode of the semiconductor laser device extending into a second waveguide, coupled to the first waveguide, and the loss in the optical cavity is modulated by modulating a loss in the second waveguide.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but by the claims attached hereto and the full breadth of equivalents to the claims.

What is claimed is:

1. A loss-modulated semiconductor laser device, comprising:
   a semiconductor-on-insulator (SOI) structure resident on a first substrate, the SOI structure comprising a waveguide in a semiconductor layer of the SOI structure;
   a semiconductor structure bonded to the semiconductor layer of the SOI structure, the semiconductor structure and the waveguide collectively defining at least a portion of a laser cavity; and
   a modulator operable for controlling a loss in the laser cavity, the modulator being located entirely in the laser cavity, and the modulator being further operable for controlling a photon lifetime in the loss-modulated semiconductor laser device by controlling at least one of a group velocity, a cavity length, a feedback coefficient, and a distributed loss in the loss-modulated semiconductor laser device, wherein the modulator comprises an n-doped region and a p-doped region that are proximate to the waveguide, the n-doped region being on a first side of the waveguide and the p-doped region being on a second side of the waveguide.

2. The loss-modulated semiconductor laser device of claim 1, wherein at least one of the n-doped region and the p-doped region is located in the semiconductor layer.

3. The loss-modulated semiconductor laser device of claim 1, wherein an optical mode of the loss-modulated semiconductor laser device is resident in the semiconductor layer and at least a portion of the semiconductor structure.

4. The loss-modulated semiconductor laser device of claim 3, wherein the n-doped region and the p-doped region control a distributed loss of the loss-modulated semiconductor laser device.

5. The loss-modulated semiconductor laser device of claim 1, wherein the modulator is operable for controlling a distributed loss in the laser cavity.

6. The loss-modulated semiconductor laser device of claim 1, wherein the semiconductor layer comprises silicon.

7. The loss-modulated semiconductor laser device of claim 1, wherein the modulator comprises a first doped region and a first portion of the waveguide, the laser cavity comprising the first portion, and the first doped region being operable for controlling carrier density in the first portion.

8. The semiconductor laser of claim 7, wherein the modulator comprises a second doped region, the first doped region being an n-doped region and the second doped region being a p-doped region, and the first doped region and second doped region being collectively operable for controlling carrier density in the first portion.

9. A semiconductor laser, comprising:
   a semiconductor-on-insulator (SOI) region comprising a semiconductor layer that includes a waveguide;
   a Group III-Group V (III-V) region, bonded to the semiconductor layer of the SOI region, the Group III-Group V (III-V) region and the semiconductor layer collectively defining at least a portion of a laser cavity; and
   a modulator operable for controlling a loss in the laser cavity, the modulator being located entirely in the laser cavity, and the modulator being further operable for modulating a photon lifetime in the semiconductor laser by modulating distributed loss in the semiconductor layer, wherein the modulator comprises an n-doped region and a p-doped region, the waveguide being between the n-doped region and the p-doped region.

10. The semiconductor laser of claim 9, wherein the semiconductor laser operates in an optical transmission system.

11. The semiconductor laser of claim 9, wherein the semiconductor layer comprises at least one of the n-doped region and the p-doped region.

12. The semiconductor laser of claim 11, wherein the semiconductor layer of the SOI structure comprises silicon.

13. A loss-modulated semiconductor laser device, comprising:
   a silicon layer comprising a waveguide that includes a first waveguide portion;
   a semiconductor structure bonded to the silicon layer, the semiconductor structure and the first waveguide portion collectively defining at least a portion of a laser cavity; and
   a loss modulator comprising a first doped semiconductor region and a second doped semiconductor region, the first doped semiconductor region and second doped semiconductor region being within the laser cavity, and the first doped semiconductor region and second doped semiconductor region being operable for controlling carrier density in the first waveguide portion, wherein the first waveguide portion is between the first doped semiconductor region and the second doped semiconductor region;
   wherein a photon lifetime in the loss-modulated semiconductor laser device is based on the carrier density in the first waveguide portion.

14. The semiconductor laser of claim 13 wherein the silicon layer comprises the first doped semiconductor region and the second doped semiconductor region.

* * * * *